United States Patent
Chung

(10) Patent No.: US 8,027,153 B2
(45) Date of Patent: Sep. 27, 2011

(54) LEAD FRAME FOR QUAD FLAT NO-LEAD PACKAGE

(75) Inventor: Feng-Chun Chung, Taichung (TW)

(73) Assignee: Lingsen Precision Industries, Ltd., Taichung (TW)

( * ) Notice: Subject to any disclaimer, the term of this patent is extended or adjusted under 35 U.S.C. 154(b) by 415 days.

(21) Appl. No.: 12/382,881

(22) Filed: Mar. 26, 2009

(65) Prior Publication Data

US 2010/0165596 A1     Jul. 1, 2010

(30) Foreign Application Priority Data

Dec. 30, 2008   (TW) ............................... 97223707 U

(51) Int. Cl.
*H05K 5/02*   (2006.01)

(52) U.S. Cl. .................. 361/613; 174/536; 174/537

(58) Field of Classification Search .................. 361/760, 361/813; 174/260, 536, 537
See application file for complete search history.

(56) References Cited

U.S. PATENT DOCUMENTS

| | | | |
|---|---|---|---|
| 6,744,118 B2* | 6/2004 | Ikenaga et al. | 257/666 |
| 7,183,630 B1* | 2/2007 | Fogelson et al. | 257/666 |
| 2005/0101055 A1* | 5/2005 | Kasahara et al. | 438/106 |
| 2008/0099784 A1* | 5/2008 | Lo et al. | 257/186 |
| 2008/0157297 A1* | 7/2008 | Kudoh | 257/666 |
| 2011/0057298 A1* | 3/2011 | Ramos et al. | 257/667 |
| 2011/0111562 A1* | 5/2011 | San Antonio et al. | 438/113 |

* cited by examiner

Primary Examiner — Yuriy Semenenko
(74) Attorney, Agent, or Firm — Bacon & Thomas, PLLC

(57) ABSTRACT

A lead frame for a quad flat no-lead package includes a plurality of units arranged in a matrix manner and each having four corners. Each of the corners extends outwards to define an attaching portion for attachment to a UV tape such that four sides of each of the units won't fly off when the sides are cut off.

3 Claims, 2 Drawing Sheets

LEAD FRAME FOR QUAD FLAT NO-LEAD PACKAGE

BACKGROUND OF THE INVENTION

1. Field of the Invention

The present invention relates generally to a lead frame, and more specifically to a lead frame for use in the quad flat no-lead package.

2. Description of the Related Art

In the quad flat no-lead (QFN) package, a chip is bound to each of units of a lead frame, and then an epoxy resin is poured into each of the units to mold the chip. Thereafter, an operator will attach a UV tape to the back of the lead frame, and then place the lead frame on a ceramic plate for cutting the units.

FIG. 1 shows a square unit 10 of a lead frame according to a prior art, having four right-angled corners 12. Because the contact areas between four sides 14 of the unit 10 located at the corner of the lead frame and the UV tape are insufficient, the sides 14 of the unit 10 may easily fly off under the action of a cutting blade rotating in high speed and a high-pressure water column during cutting process of the unit 10, probably causing the cutting blade and the chip to be damaged by the flying sides 14.

In order to eliminate the above-mentioned drawback, some operators will attach another UV tape to the sides 14 of the unit 10 located at the corner of the lead frame, but the operation time, manpower and material costs will be increased due to the extra UV tape.

SUMMARY OF THE INVENTION

The present invention has been accomplished in view of the above-noted circumstances. It is one objective of the present invention to provide a lead frame that can increase the area of each of units attaching a UV tape.

It is another objective of the present invention to provide a lead frame that can increase mold area.

To achieve these objectives of the present invention, the lead frame comprises a plurality of units arranged in a matrix manner and each having four corners. Each of the corners extends outwards to define an attaching portion for attachment to a UV tape.

Accordingly, the area to which the UV tape is attached and the area into which the resin is poured can be increased through the attaching portions so as to prevent the sides of the unit from flying off during the cutting process.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
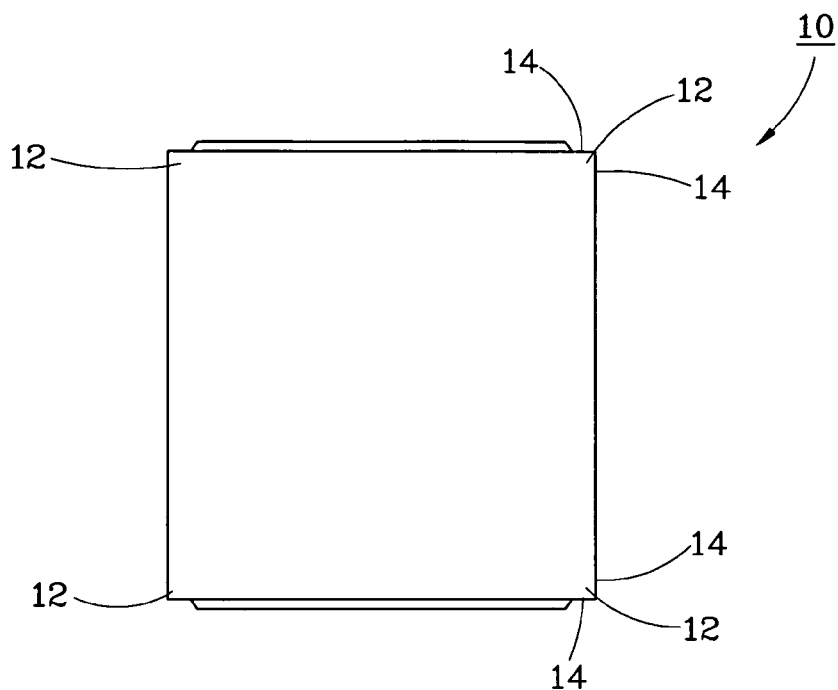
FIG. 1 is a schematic drawing of a unit of a lead frame according to a prior art.
Figure 2:
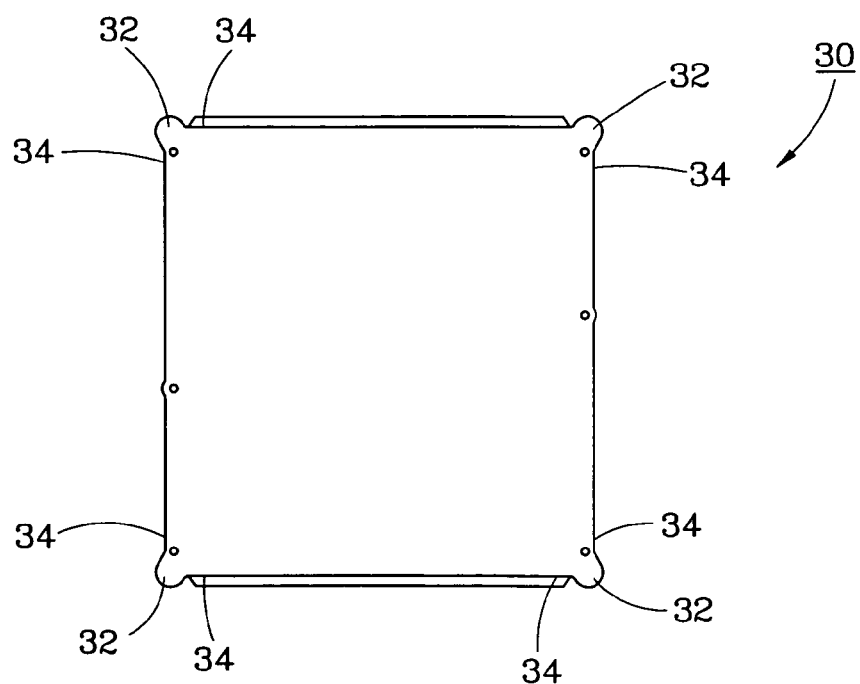
FIG. 2 is a schematic drawing of a unit of a lead frame according to a preferred embodiment of the present invention.
Figure 3:
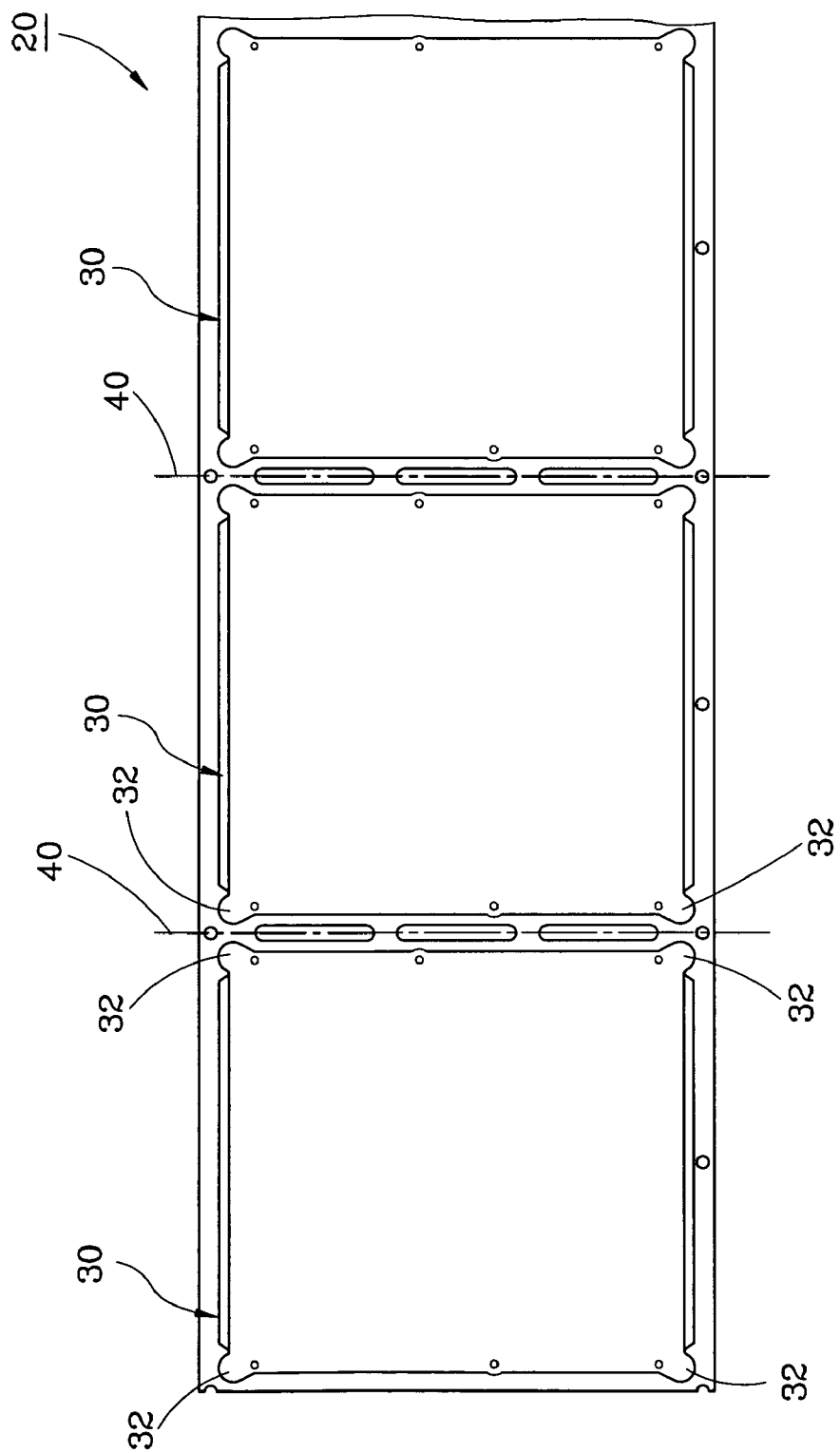
FIG. 3 is a schematic drawing of a part of a lead frame according to the preferred embodiment of the present invention.

As shown in FIGS. 2 and 3, a lead frame 20 in accordance with a preferred embodiment of the present invention comprises a plurality of units 30 arranged in a matrix manner. A cutting line 40 is defined between two adjacent units 30.

The units 30 each have four corners, each of which extends outwards and curvedly to define a curved attaching portion 32 for attachment of a UV tape. The periphery of each of the attaching portions 32 doesn't exceed the cutting line 40, and the attaching portion 32 is not limited to the curved shape.

By means of the extended attaching portions 32, the resin can be poured into the attaching portions 32 such that the mold area can be increased; and further, the contact areas between the sides 34 of the unit 30 located at the corner of the lead frame 20 and the UV tape are sufficient to ensure that the sides 34 won't fly off under the action of a high-speed rotating blade and a high-pressure water column when the sides 34 are cut off, thereby preventing the blade and the chip from damage caused by the flying sides 34.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A lead frame comprising:
a plurality of units arranged in a matrix manner and each having four corners, the corners each extending outwards to define an attaching portion for attachment to a UV tape.

2. The lead frame as claimed in claim 1, wherein the attaching portions each have a curved shape.

3. The lead frame as claimed in claim 1, wherein the attaching portions each have a periphery that doesn't exceed a cutting line defined between two adjacent said units.

* * * * *

UNITED STATES PATENT AND TRADEMARK OFFICE
CERTIFICATE OF CORRECTION

| | | |
|---|---|---|
| PATENT NO. | : 8,027,153 B2 | Page 1 of 1 |
| APPLICATION NO. | : 12/382881 | |
| DATED | : September 27, 2011 | |
| INVENTOR(S) | : Feng-Chun Chung | |

It is certified that error appears in the above-identified patent and that said Letters Patent is hereby corrected as shown below:

1) Title Page item 57 of Patent Document: Abstract (57), Line 3 - "comers" should read "corners";

2) Col. 1 Line 18 "comers" should read "corners";

3) Col. 1 Line 42 "comers" should read "corners";

4) Col. 2 Line 23 "comers" should read "corners";

5) Col. 2 Line 46 "comers" should read "corners".

Signed and Sealed this
Third Day of April, 2012

David J. Kappos
*Director of the United States Patent and Trademark Office*